US012690248B2

(12) United States Patent
Vanukuru et al.

(10) Patent No.: US 12,690,248 B2
(45) Date of Patent: Jul. 21, 2026

(54) TRANSISTOR STRUCTURES WITH INTERLEAVED BODY CONTACTS AND GATE CONTACTS

(71) Applicant: GlobalFoundries U.S. Inc., Malta, NY (US)

(72) Inventors: Venkata Narayana Rao Vanukuru, Karnataka (IN); Steven M. Shank, Jericho, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 799 days.

(21) Appl. No.: 18/098,188

(22) Filed: Jan. 18, 2023

(65) Prior Publication Data

US 2024/0243175 A1     Jul. 18, 2024

(51) Int. Cl.
*H10D 62/17*        (2025.01)
*H10D 86/00*        (2025.01)
*H10W 20/00*        (2026.01)

(52) U.S. Cl.
CPC ......... H10D 62/378 (2025.01); H10D 86/201 (2025.01); H10W 20/021 (2026.01)

(58) Field of Classification Search
CPC .. H10D 62/378; H10D 86/201; H10W 20/021
See application file for complete search history.

(56) References Cited

U.S. PATENT DOCUMENTS

| | | |
|---|---|---|
| 10,424,664 B2 | 9/2019 | Ellis-Monaghan |
| 10,573,724 B2 | 2/2020 | Cheng |

| | | |
|---|---|---|
| 2007/0034903 A1 | 2/2007 | Sutardja |
| 2017/0287836 A1 | 10/2017 | Wang et al. |
| 2020/0373410 A1 | 11/2020 | Lee et al. |
| 2021/0265242 A1 | 8/2021 | Wang et al. |
| 2022/0077282 A1* | 3/2022 | Loechelt ............ H10D 64/2527 |

FOREIGN PATENT DOCUMENTS

| | | |
|---|---|---|
| DE | 102014224846 A1 | 6/2016 |

OTHER PUBLICATIONS

European Patent Office, Extended European Search Report and Opinion issued in European Patent Application No. 23215717.2 on Jun. 5, 2024; 13 pages.

(Continued)

*Primary Examiner* — Trang Q Tran
(74) *Attorney, Agent, or Firm* — Thompson Hine LLP; Francois Pagette

(57)     ABSTRACT

Structures including a field-effect transistor field-effect and methods of forming a structure including a field-effect transistor. The structure comprises a trench isolation region in a substrate, and a body contact region that extends through the trench isolation region to the substrate. The structure further comprises a field-effect transistor including a gate connector, a first gate finger that extends from the gate connector, a second gate finger that extends from the gate connector, and a source/drain region disposed between the first gate finger and the second gate finger. The gate connector is positioned over the trench isolation region. The structure further comprises a gate contact coupled to the gate connector, and a body contact that penetrates through a portion of the gate connector to the body contact region.

20 Claims, 6 Drawing Sheets

(56) References Cited

OTHER PUBLICATIONS

A. Razavieh et al., "FinFET with Contact over Active-Gate for 5G Ultra-Wideband Applications," 2020 IEEE Symposium on VLSI Technology, 2020, pp. 1-2, doi: 10.1109/VLSITechnology18217. 2020.9265095.

A. Daghighi, "Output-Conductance Transition-Free Method for Improving the Radio-Frequency Linearity of Silicon-on-Insulator MOSFET Circuits," in IEEE Transactions on Electron Devices, vol. 61, No. 7, pp. 2257-2263, Jul. 2014, doi: 10.1109/TED.2014. 2321419.

Shank, Steven M. et al., "Contact-Over-Active-Gate Transistor Structures With Contacts Landed on Enlarged Gate Portions" filed on Oct. 21, 2021 as a U.S. Appl. No. 17/506,992.

* cited by examiner

TRANSISTOR STRUCTURES WITH INTERLEAVED BODY CONTACTS AND GATE CONTACTS

BACKGROUND

The disclosure relates to semiconductor device fabrication and integrated circuits and, more specifically, to structures including a field-effect transistor and methods of forming a structure including a field-effect transistor.

A low-noise amplifier is an electronic device found in radiofrequency integrated circuits that is capable of amplifying a low-power signal without significantly degrading the signal-to-noise ratio. A power amplifier is an electronic device found in radiofrequency integrated circuits that is capable of amplifying a low-power signal with a high efficiency. Low-noise amplifiers and power amplifiers may include a multiple-finger field-effect transistor in their construction. Placing the gate contacts over the active region of the field-effect transistor may be effective to reduce the gate resistance, but may require special enabling measures. The addition of body contacts may permit the body of the field-effect transistor in the active region to be biased. However, the body contacts may cause a reduction in the threshold frequency of the field-effect transistor.

Structures including a field-effect transistor and methods of forming a structure including a field-effect transistor are needed.

SUMMARY

In an embodiment of the invention, a structure comprises a trench isolation region in a substrate, and a body contact region that extends through the trench isolation region to the substrate. The structure further comprises a field-effect transistor including a gate connector, a first gate finger that extends from the gate connector, a second gate finger that extends from the gate connector, and a source/drain region disposed between the first gate finger and the second gate finger. The gate connector is positioned over the trench isolation region. The structure further comprises a gate contact coupled to the gate connector, and a body contact that penetrates through a portion of the gate connector to the body contact region.

In an embodiment of the invention, a structure comprises a silicon-on-insulator substrate including a semiconductor layer, a semiconductor substrate, and a buried oxide layer between the semiconductor layer and the semiconductor substrate. The structure further comprises an isolation region in the semiconductor layer, and a body contact region comprising a portion of the semiconductor layer that is adjacent to the isolation region. The structure further comprises a field-effect transistor including a gate connector, a first gate finger that extends from the gate connector, a second gate finger that extends from the gate connector, and a source/drain region disposed between the first gate finger and the second gate finger. The gate connector is positioned over the isolation region. The structure further comprises a gate contact coupled to the gate connector, and a body contact that penetrates through a portion of the gate connector to the body contact region.

In an embodiment of the invention, a method comprises forming a trench isolation region in a substrate, and forming a body contact region that extends through the trench isolation region to the substrate. The method further comprises forming a field-effect transistor including a gate connector, a first gate finger that extends from the gate connector, a second gate finger that extends from the gate connector, and a source/drain region disposed between the first gate finger and the second gate finger. The gate connector is positioned over the trench isolation region. The method further comprises forming a gate contact coupled to the gate connector, and forming a body contact that penetrates through a portion of the gate connector to the body contact region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 4A is a cross-sectional view of the structure taken generally along line 4A-4A in

FIG. 3.

DETAILED DESCRIPTION

Figure 1:
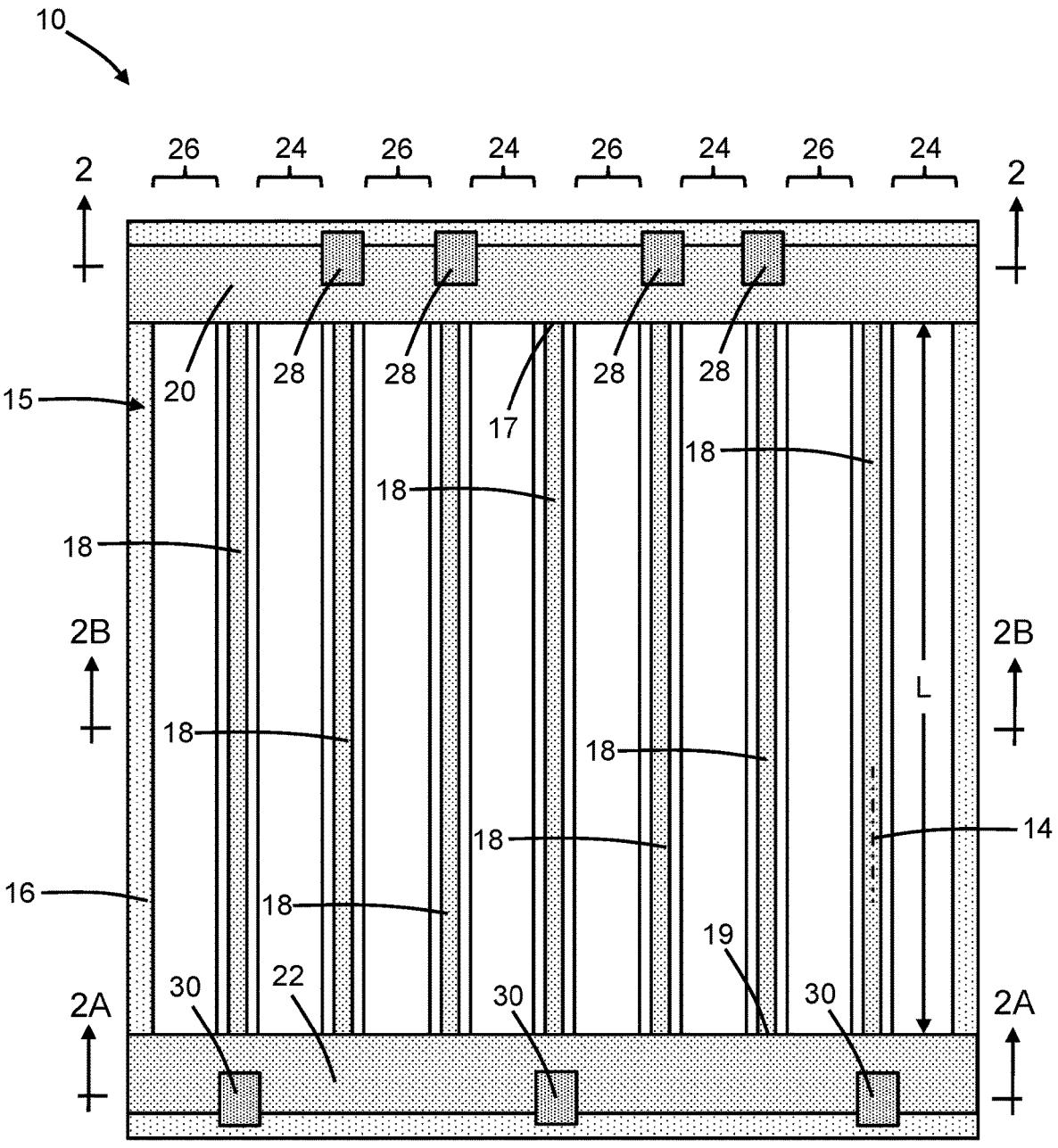
FIG. 1 is a top view of a structure at an initial fabrication stage of a processing method in accordance with embodiments of the invention.
Figure 2:
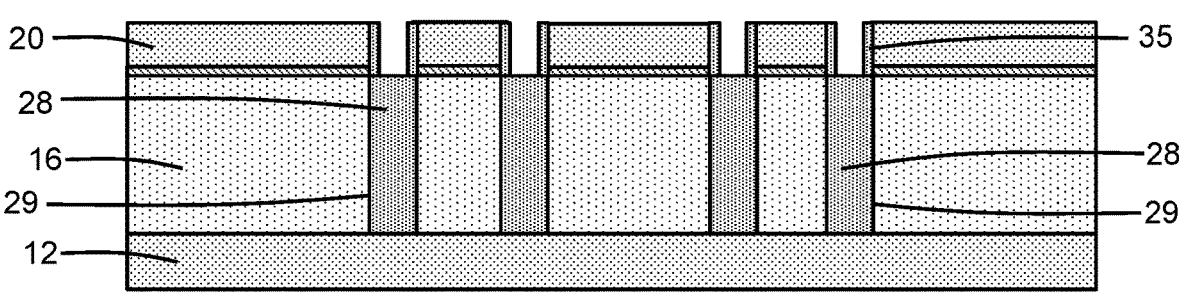
FIG. 2 is a cross-sectional view of the structure taken generally along line 2-2 in FIG. 1.
Figure 2A:
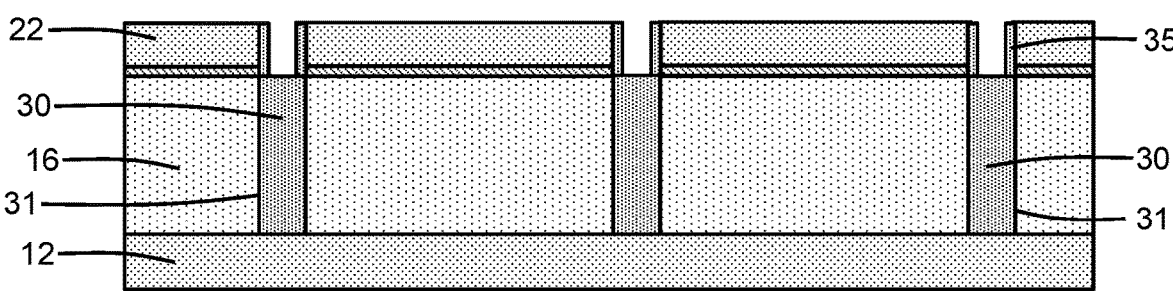
FIG. 2A is a cross-sectional view of the structure taken generally along line 2A-2A in FIG. 1.
Figure 2B:
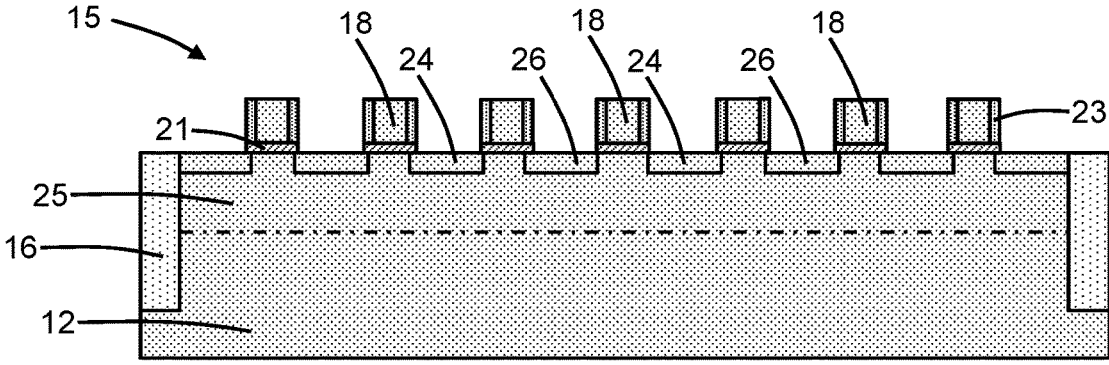
FIG. 2B is a cross-sectional view of the structure taken generally along line 2B-2B in FIG. 1.
Figure 3:
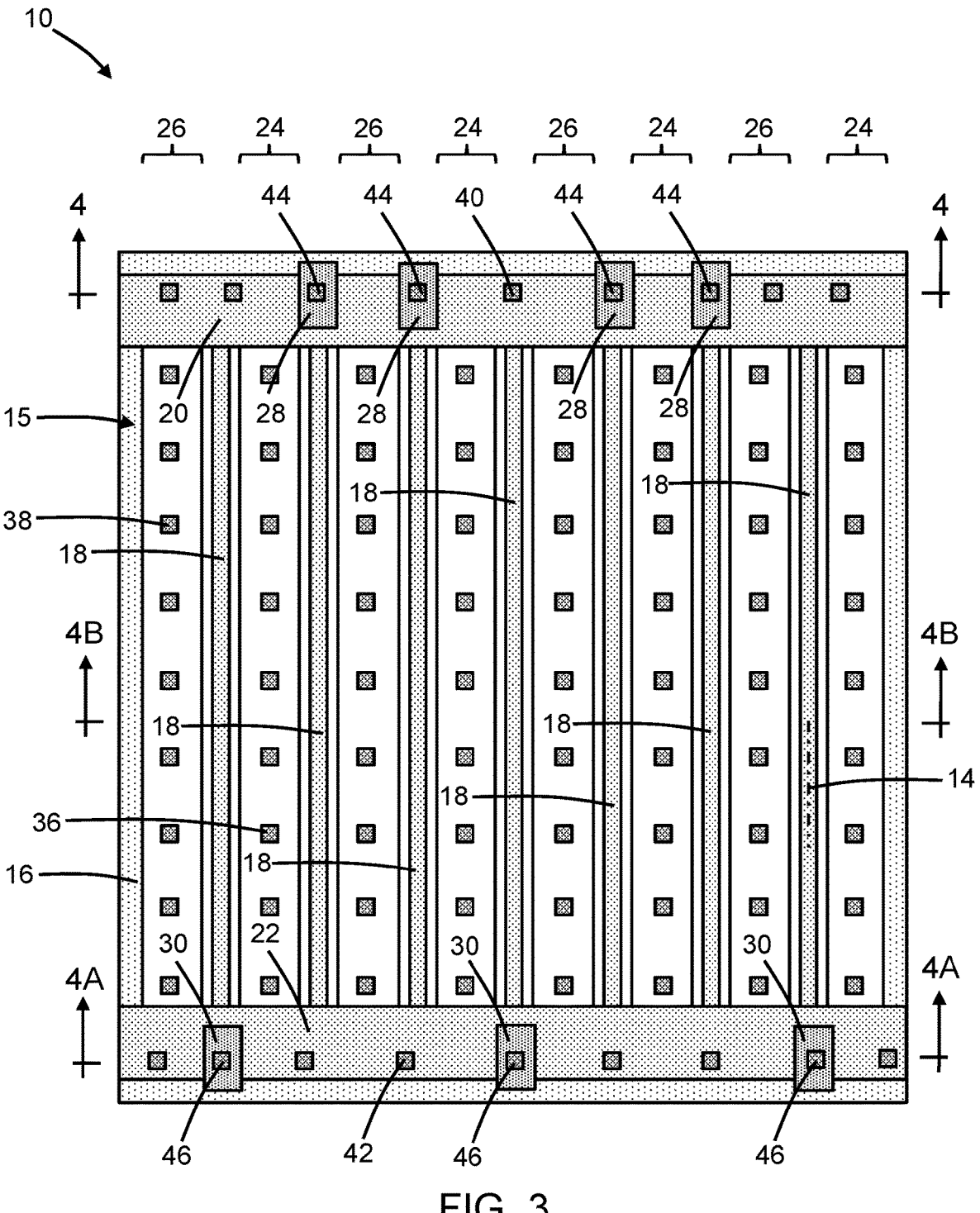
FIG. 3 is a top view of the structure at a fabrication stage of the processing method subsequent to FIG. 1.
Figure 4:
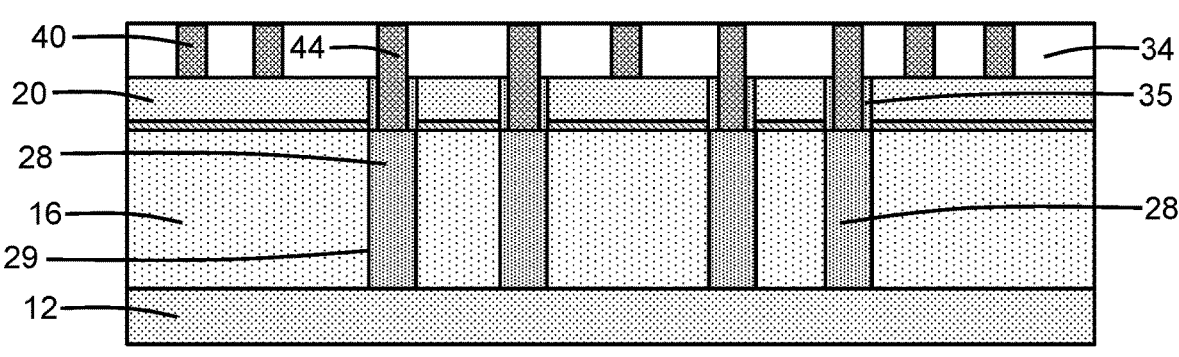
FIG. 4 is a cross-sectional view of the structure taken generally along line 4-4 in FIG. 3.
Figure 4A:
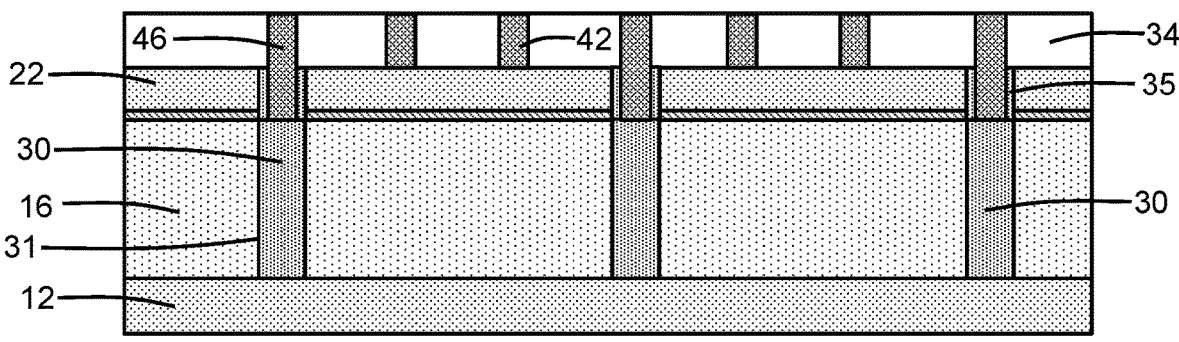
Figure 4B:
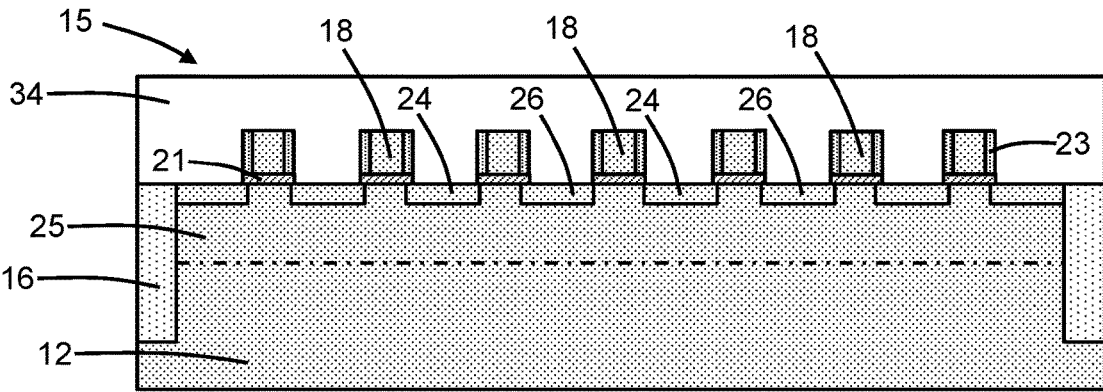
FIG. 4B is a cross-sectional view of the structure taken generally along line 4B-4B in FIG. 3.

With reference to FIGS. 1, 2, 2A, 2B and in accordance with embodiments of the invention, a device structure 10 includes a field-effect transistor 15 that may be formed using a substrate 12 in the representative form of a bulk substrate. The substrate 12 may be comprised of a semiconductor material, such as single-crystal silicon, and the substrate 12 may be doped (e.g., lightly doped) with a p-type dopant (e.g., boron) to provide p-type conductivity. Trench isolation regions 16 may be formed in the substrate 12. The trench isolation regions 16 surround an active region that is comprised of a portion of the semiconductor material of the substrate 12 and in which the field-effect transistor 15 is formed. The trench isolation regions 16 may be formed by a shallow trench isolation technique that patterns trenches in the substrate 12 with lithography and etching processes, deposits a dielectric material to overfill the trenches, and planarizes the dielectric material using chemical mechanical polishing and/or an etch back. The dielectric material contained in the trench isolation regions 16 may be comprised of an electrical insulator, such as silicon dioxide.

The field-effect transistor 15 may be fabricated by front-end-of-line processing in the active region of the substrate 12. In an embodiment, the field-effect transistor 15 may be deployed in a low-noise amplifier found in a radio-frequency circuit. In an embodiment, the field-effect transistor 15 may be deployed in a power amplifier found in a radio-frequency circuit.

The field-effect transistor 15 may include a gate having multiple gate fingers 18, a gate connector 20, and a gate connector 22 that are disposed on a top surface of the substrate 12, as well as source/drain regions 24 and source/drain regions 26 that are disposed in the substrate 12. The gate fingers 18 may be aligned parallel to each other, the gate fingers 18 may be connected at one end to the gate connector 20, and the gate fingers 18 may be connected at an opposite end to the gate connector 22. The gate fingers 18 and gate connectors 20, 22 may be formed by patterning a deposited layer of a conductor, such as heavily-doped polysilicon, with lithography and etching processes. The gate fingers 18 are patterned as elongate strips comprised of the conductor that extend from the gate connector 20 across the active region to the gate connector 22, and the gate connectors 20, 22 are patterned as elongate strips of the conductor that may be oriented transverse to the gate fingers 18. The gate fingers 18 may have a length L, and each gate finger 18 may extend longitudinally along a longitudinal axis 14 from an inner side edge 17 of the gate connector 20 to an inner side edge 19 of the gate connector 22. The inner side edges 17, 19 face each other across the active region. The gate fingers 18 are arranged in the space over the active region between the inner side edges 17, 19.

The source/drain regions 24 and the source/drain regions 26 are disposed in the substrate 12 between the gate fingers 18. The source/drain regions 24 and source/drain regions 26 may be formed by self-aligned ion implantation of a dopant (e.g., an n-type dopant) under given set of implantation conditions into the substrate 12. The implantation conditions (e.g., ion species, dose, kinetic energy) may be selected to tune the electrical and physical characteristics of the source/drain regions 24 and source/drain regions 26. In an embodiment, the source/drain regions 24 and source/drain regions 26 may contain semiconductor material that is doped with an n-type dopant (e.g., phosphorus and/or arsenic) to provide n-type conductivity. As used herein, the term "source/drain region" means a doped region of semiconductor material that can function as either a source or a drain of the field-effect transistor 15. In an embodiment, the source/drain regions 24 may define source regions of the field-effect transistor 15 and the source/drain regions 26 may define drain regions of the field-effect transistor 15.

A well 25 may be formed in the substrate 12 before forming the source/drain regions 24 and source/drain regions 26. The well 25 may be formed by ion implantation of a dopant having an opposite conductivity type from the source/drain regions 24 and source/drain regions 26. A channel region constituted by a portion of the well 25 is arranged in the substrate 12 beneath each gate finger 18 and laterally between each adjacent pair of source/drain regions 24, 26. The well 25 defines a body region of the field-effect transistor 15.

The field-effect transistor 15 may include a gate dielectric 21 disposed between the gate fingers 18 and the substrate 12, as well as sidewall spacers 23 disposed on the gate fingers 18. In an embodiment, the gate dielectric 21 may be comprised of a dielectric material, such as silicon dioxide. In an embodiment, the sidewall spacers 23 may be comprised of a dielectric material, such as silicon nitride.

The device structure 10 further includes body contact regions 28 and body contact regions 30 that are arranged at the periphery of the active region. The body contact regions 28, 30 are electrically and physically coupled to the well 25 defining the body region of the field-effect transistor 15. The body contact regions 28 are disposed in respective lower portions of openings 29 that penetrate fully through the gate connector 20 and fully through the trench isolation region 16 beneath the gate connector 20 to the substrate 12. The body contact regions 30 are disposed in respective lower portions of openings 31 that penetrate fully through the gate connector 22 and fully through the trench isolation region 16 beneath the gate connector 22 to the substrate 12.

In an embodiment, the body contact regions 28, 30 may be comprised of a semiconductor material, such as a doped semiconductor material like doped polysilicon. In an embodiment, the body contact regions 28, 30 may be formed by patterning the openings 29, 31 in the gate connectors 20, 22 with lithography and etching processes, depositing a layer of the semiconductor material, planarizing the deposited conductor, and recessing the portions of the conductor in the openings 29, 31 following planarization. In an alternative embodiment, the body contact regions 28, 30 may be formed from a patterned layer of the semiconductor material and may be surrounded by fill provided by the subsequently-deposited dielectric material of the trench isolation regions 16 during formation of the trench isolation regions 16. In an embodiment, the body contact regions 28, 30 may be comprised of polysilicon containing a p-type dopant to provide p-type conductivity. In an embodiment, the body contact regions 28, 30 may be comprised of polysilicon doped to have an opposite conductivity type from the doped polysilicon contained in the gate fingers 18. In an embodiment, the body contact regions 28, 30 may be comprised of a doped semiconductor material, such as doped polysilicon, having the same conductivity type as the well 25. In an embodiment, the body contact regions 28, 30 may be doped by ion implantation.

The body contact regions 28 are offset outwardly from the inner side edge 17 of the gate connector 20 to preserve the continuity of the gate connector 20 at the locations of the body contact regions 28. Similarly, the body contact regions 30 are offset outwardly from the inner side edge 19 of the gate connector 22 to preserve the continuity of the gate connector 22 at the locations of the body contact regions 30.

Spacers 35 may be formed on the sidewalls of the gate connector 20 bordering the upper portion of each opening 29. The spacers 35 may also be formed on the sidewalls of the gate connector 22 bordering the upper portion of each opening 31. The spacers 35 may be comprised of a dielectric material, such as silicon nitride, that is conformally deposited and anisotropically etched.

With reference to FIGS. 3, 4, 4A, 4B in which like reference numerals refer to like features in FIGS. 1, 2, 2A, 2B and at a subsequent fabrication stage of the processing method, a dielectric layer 34 may be formed, and source contacts 36, drain contacts 38, gate contacts 40, 42, and body contacts 44, 46 of a local interconnect structure or contact level may be formed in the dielectric layer 34. The dielectric layer 34 may be comprised of a dielectric material, such as silicon dioxide, that is an electrical insulator, and the source contacts 36, drain contacts 38, gate contacts 40, 42, and body contacts 44, 46 may be comprised of a metal, such as tungsten. The source contacts 36 penetrate through the dielectric layer 34 to land at a series of locations on each source/drain region 24. Similarly, the drain contacts 38 penetrate through the dielectric layer 34 to land at a series of locations on each source/drain region 26.

The gate contacts 40 are physically and electrically coupled to the gate connector 20, and the gate contacts 42 are physically and electrically coupled to the gate connector 22. In that regard, the gate contacts 40 penetrate through the dielectric layer 34 to land at a series of different locations on the gate connector 20, and the gate contacts 42 penetrate through the dielectric layer 34 to land at a series of different locations on the gate connector 22.

The body contacts 44 are physically and electrically coupled to the body contact regions 28, and the body contacts 46 are physically and electrically coupled to the body contact regions 30. In that regard, the body contacts 44 penetrate through the dielectric layer 34 and the upper portions of the openings 29 to land on the body contact regions 28, and the body contacts 46 penetrate through the dielectric layer 34 and the upper portions of the openings 31 to land on the body contact regions 30. Each body contact 44 penetrates through a portion of the gate connector 20 to one of the body contact regions 28. The spacers 35 are disposed between the body contacts 44 and the gate connector 20 in the upper portions of the openings 29 to provide electrical isolation. Each body contact 46 penetrates through a portion of the gate connector 22 to one of the body contact regions 30. The spacers 35 are also disposed between the body contacts 46 and the gate connector 22 in the upper portions of the openings 31 to provide electrical isolation.

The gate contacts 40 and the body contacts 44 are positioned with a spaced-apart arrangement and interleaved along the length of the gate connector 20 with the gate contacts 40 disposed adjacent to the body contacts 44. In an embodiment, the gate contacts 40 may be intermingled and interleaved with the body contacts 44 in an array (e.g., a row) along the length of the gate connector 20. In an embodiment, the gate contacts 40 and the body contacts 44 may be arranged and interleaved in a pattern along the length of the gate connector 20. In an embodiment, the placement of the gate contacts 40 and the body contacts 44 may vary along the length of the gate connector 20 and lack a pattern. In an embodiment, the body contacts 44 and the body contact regions 28 may be aligned with the gate fingers 18. In an embodiment, the body contacts 44 and the body contact regions 28 may be non-aligned with the gate fingers 18. In an embodiment, two or more of the body contact regions 28 may be arranged immediately adjacent to each other such the corresponding body contacts 44 are adjacent without intervening gate contacts 40.

The gate contacts 42 and the body contacts 46 are positioned with a spaced-apart arrangement along the length of the gate connector 22 with the gate contacts 42 disposed adjacent to the body contacts 46. In an embodiment, the gate contacts 42 may be intermingled and interleaved with the body contacts 46 in a row or an array along the length of the gate connector 22. In an embodiment, the gate contacts 42 and the body contacts 46 may be arranged in a pattern along the length of the gate connector 22. In an embodiment, the placement of the gate contacts 42 and the body contacts 46 may vary along the length of the gate connector 22 and lack a pattern. In an embodiment, one or more of the body contact regions 30 and body contacts 46 may be aligned with the gate fingers 18. In an embodiment, one or more of the body contact regions 30 and body contacts 46 may be non-aligned with the gate fingers 18. In an embodiment, two or more of the body contact regions 30 may be arranged immediately adjacent to each other such the corresponding body contacts 46 are adjacent without intervening gate contacts 42.

The body contact regions 28, 30 and the body contacts 44, 46 may permit biasing of the body of the field-effect transistor 15 to improve, for example, linearity and the third-order input intercept point during operation while maintaining a high threshold frequency. The interleaving of the body contact regions 28 and body contacts 44 beneath the gate connector 20 and the body contact regions 30 and body contacts 46 beneath the gate connector 22 at both sides of the active region may provide a low gate resistance and a low minimum noise factor.

Figure 5:
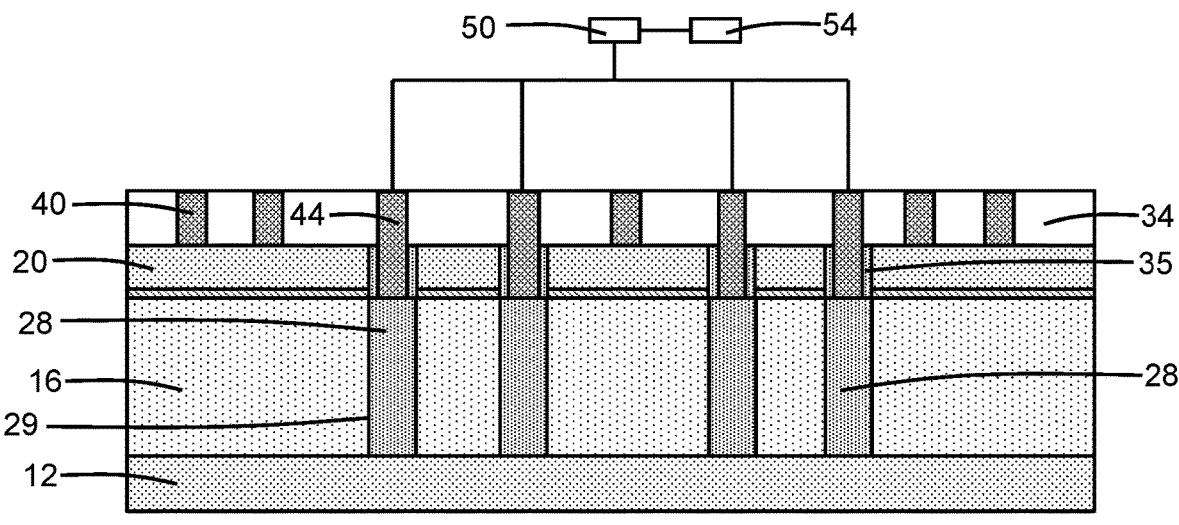
FIGS. 5 and 5A are cross-sectional views of a structure in accordance with alternative embodiments of the invention.
Figure 5A:
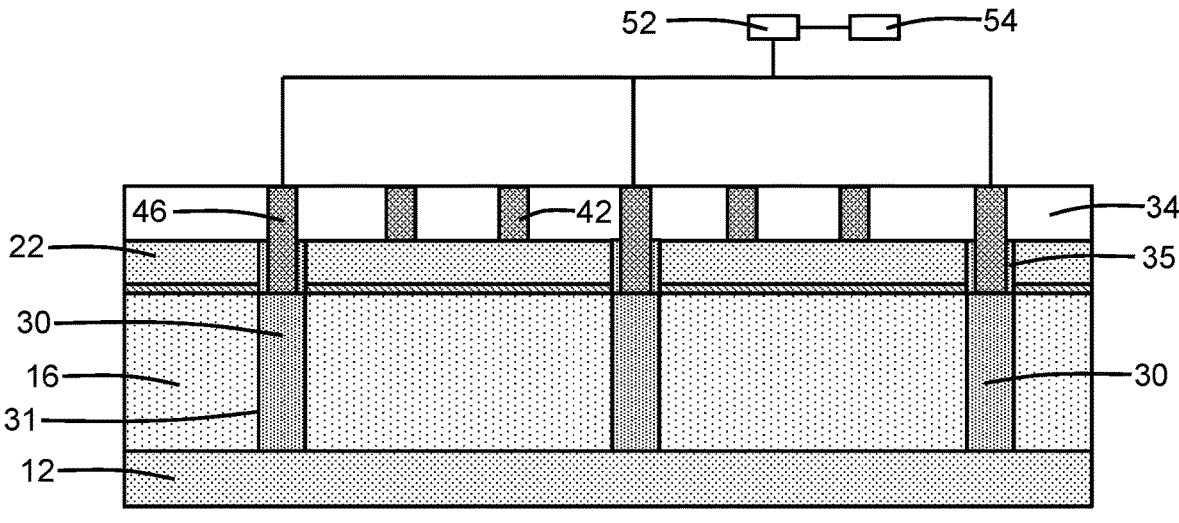

With reference to FIGS. 5, 5A and in accordance with alternative embodiments of the invention, the device structure 10 may include an external resistor 50 that is physically and electrically connected to the body contacts 44 and an external resistor 52 that is physically and electrically connected to the body contacts 46. A power supply 54 may be coupled by the external resistor 50 to the body contacts 44 and by the external resistor 52 to the body contacts 46. The power supply 54 may be utilized, during operation of the field-effect transistor 15, to bias the body contact regions 28, 30 and well 25.

Figure 6:
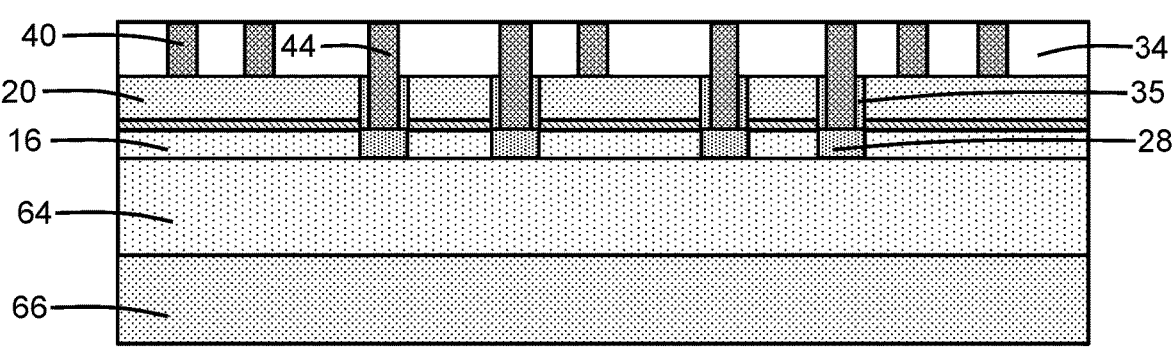
FIGS. 6, 6A, and 6B are cross-sectional views of a structure in accordance with alternative embodiments of the invention.
Figure 6A:
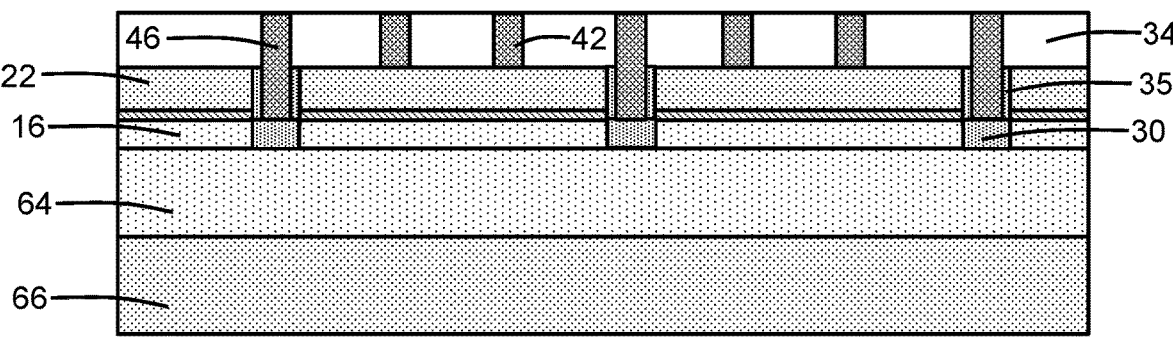
Figure 6B:
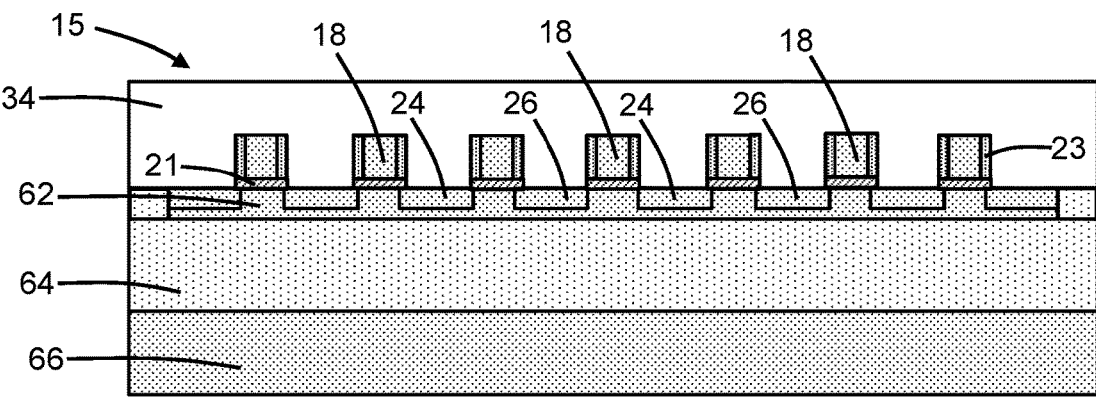

With reference to FIGS. 6, 6A, 6B and in accordance with alternative embodiments of the invention, the device structure 10 may be formed using silicon-on-insulator substrate that includes a device layer 62, a buried oxide layer 64, and a semiconductor substrate 66. The device layer 62 is separated from the semiconductor substrate 66 by the intervening buried oxide layer 64 and may be significantly thinner than the semiconductor substrate 66. The device layer 62 is electrically isolated from the semiconductor substrate 66 by the buried oxide layer 64. The device layer 62 and the semiconductor substrate 66 may be comprised of a semiconductor material, such as single-crystal silicon, and the buried oxide layer 64 may be comprised of silicon dioxide. The semiconductor substrate 66 may be lightly doped to have, for example, p-type conductivity. The trench isolation regions 16 extend through the device layer 62 to the buried oxide layer 64.

The body contact regions 28, 30 are represented by portions of the device layer 62 that are contacted by the body contacts 44, 46. These contacted portions of the device layer 62 are separated from the semiconductor substrate 66 by the dielectric material of the buried oxide layer 64. Each body contact region 28 is positioned adjacent to a portion of one of the trench isolation regions 16. Adjacent pairs of the body contact regions 28 are separated from each other by the dielectric material of the trench isolation region 16. Each body contact region 30 is positioned adjacent to a portion of one of the trench isolation regions 16. Adjacent pairs of the body contact regions 30 are separated from each other by the dielectric material of the trench isolation region 16. A portion of the buried oxide layer 64 is disposed in a lateral direction between the body contact region 28 and the body contact region 30.

In an embodiment, each of the body contact regions 28 may be aligned with one of the gate fingers 18. In an embodiment, each of the body contact regions 30 may be aligned with one of the gate fingers 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate;
a first trench isolation region in the substrate;
a field-effect transistor including a first gate connector, a first gate finger that extends from the first gate connector, a second gate finger that extends from the first gate connector, and a source/drain region disposed between the first gate finger and the second gate finger, the first gate connector positioned over the first trench isolation region;
a first body contact region that extends through the first trench isolation region to the substrate;
a first gate contact coupled to the first gate connector; and
a first body contact that penetrates through a first portion of the first gate connector to the first body contact region.

2. The structure of claim 1 further comprising:
a dielectric spacer between the first body contact and the first portion of the first gate connector.

3. The structure of claim 1 further comprising:
a second body contact region that extends through the first trench isolation region to the substrate; and
a second body contact that penetrates through a second portion of the first gate connector to the second body contact region.

4. The structure of claim 3 wherein the first trench isolation region comprises a dielectric material, and the first body contact region is separated from the second body contact region by the dielectric material of the first trench isolation region.

5. The structure of claim 3 wherein the first body contact region is positioned adjacent to the second body contact region, and the first gate contact is positioned between the first body contact and the second body contact.

6. The structure of claim 3 wherein the first body contact region is positioned adjacent to the second body contact region, and the first body contact is positioned between first gate contact and the second body contact.

7. The structure of claim 3 further comprising:
a second gate contact coupled to the first gate connector, wherein the first body contact is positioned between the first gate contact and the second gate contact.

8. The structure of claim 7 wherein the first body contact, the second body contact, the first gate contact, and the second gate contact are interleaved in an array along a length of the first gate connector.

9. The structure of claim 1 further comprising:
a second trench isolation region in the substrate, wherein the field-effect transistor includes a second gate connector, the first gate finger extends longitudinally from the first gate connector to the second gate connector, the second gate finger extends longitudinally from the first gate connector to the second gate connector, and the second gate connector is positioned over the second trench isolation region.

10. The structure of claim 9 further comprising:
a second body contact region that extends through the second trench isolation region to the substrate; and
a second body contact that penetrates through a portion of the second gate connector to the second body contact region.

11. The structure of claim 10 further comprising:
a second gate contact coupled to the second gate connector.

12. The structure of claim 10 further comprising:
a first dielectric spacer between the first body contact and the first portion of the first gate connector; and
a second dielectric spacer between the second body contact and the portion of the second gate connector.

13. The structure of claim 10 wherein the first body contact region and the second body contact region comprise a doped semiconductor material, and the first body contact and the second body contact comprise a metal.

14. The structure of claim 1 wherein the first body contact region comprises a doped semiconductor material.

15. The structure of claim 1 further comprising:
an external resistor; and
a power supply coupled by the external resistor to the first body contact.

16. The structure of claim 1 wherein the first body contact region is aligned with the first gate finger.

17. The structure of claim 1 wherein the first gate finger and the second gate finger comprise a first semiconductor material having a first conductivity type, and the first body contact region comprises a second semiconductor material having a second conductivity type opposite to the first conductivity type.

18. The structure of claim 1 wherein the first body contact comprises a metal.

19. The structure of claim 1 wherein the first body contact and the first gate contact comprise a metal.

20. A method comprising:

forming a trench isolation region in a substrate;

forming a field-effect transistor including a gate connector, a first gate finger that extends from the gate connector, a second gate finger that extends from the gate connector, and a source/drain region disposed between the first gate finger and the second gate finger, wherein the gate connector is positioned over the trench isolation region;

forming a body contact region that extends through the trench isolation region to the substrate;

forming a gate contact coupled to the gate connector; and forming a body contact that penetrates through a portion of the gate connector to the body contact region.

* * * * *